(12) United States Patent
Watanabe et al.

(10) Patent No.: US 6,580,183 B2
(45) Date of Patent: Jun. 17, 2003

(54) ELECTRIC CIRCUIT SHIELDING

(75) Inventors: Masahiro Watanabe, Tokyo (JP); Kazuo Kato, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/101,494

(22) Filed: Mar. 20, 2002

(65) Prior Publication Data

US 2003/0080627 A1 May 1, 2003

(30) Foreign Application Priority Data

Oct. 25, 2001 (JP) ......................................... 2001-327637

(51) Int. Cl.[7] ................................................ H04B 15/00
(52) U.S. Cl. .......................... 307/91; 324/96; 73/1.08; 219/482
(58) Field of Search ................................ 307/10.1, 117, 307/91, 149, 154; 324/96, 72.5, 76.11; 73/1.08; 219/482

(56) References Cited

U.S. PATENT DOCUMENTS 6,380,725 B1 * 4/2002 Chavez et al. ................. 324/96
6,459,252 B1 * 10/2002 Bierer ........................ 324/72.5

* cited by examiner

*Primary Examiner*—Brian Sircus
*Assistant Examiner*—Calixto Rodriguez
(74) *Attorney, Agent, or Firm*—Crowell & Moring LLP

(57) ABSTRACT

A measuring circuit capable of performing a high-accuracy measurement by eliminating inductive influence from an ambient noise voltage source. An electric circuit including a signal circuit of high impedance, a wiring conductor and a meter is provided with a shielding resistance member having a significantly lower resistance than that of the signal circuit in dependence on an inter-terminal voltage of the high impedance signal circuit and a shield formed of an electrically conductive material disposed in association with the wiring conductor. A voltage distribution function of the shielding resistance member is matched equally to that of an inter-terminal voltage distribution function of the signal circuit. By measuring a line voltage through the medium of the high impedance signal circuit shielded by the shielding resistor, high accuracy measurement can be realized without undergoing adverse influences of parasitic capacitance and induction.

2 Claims, 5 Drawing Sheets

ELECTRIC CIRCUIT SHIELDING

BACKGROUND OF THE INVENTION

The present invention relates generally to a measuring circuit for measuring an AC voltage. More particularly, the invention is concerned with a measuring circuit which is capable of measuring a three-phase AC power supply with high precision or accuracy while eliminating induction noise notwithstanding high impedance.

The conventional measuring circuit known heretofore is constituted by a voltage source whose impedance is as low as possible and designed such that a signal circuit to be shielded is covered with a shielding circuit whose electrical potential changes similarly or equally to a specific voltage behavior of the signal circuit to be shielded or is fixed stably. However, in a signal circuit in which the voltage changes over a wide range as in the case of a high-resistance bleeder, the shielding potential can not definitely be specified with the conventional method. Besides, the influence of parasitic capacitance attributable to the shielding can not be eliminated. Thus, the conventional shielding method can not be employed for such applications where the voltage is determined in terms of an integrated value.

In recent years, in accompanying diversification of the decentralized power supply system, the line current flowing through distribution lines exhibits much complicated behaviors. Under the circumstances, there exists a great demand for enhancement of economical operation and reliability of a 6.6-kV distribution system. Since in this distribution system, the voltage measurement is performed for balanced three-phase alternating current (AC), measurement of lower line voltage (6.6 kV/$\sqrt{3}$) with reference to the ground is more convenient and simpler when compared with the measurement of high line-to-line voltages (inter-line voltage). Additionally, the measuring circuit should preferably be implemented as a low-current/high-impedance measuring circuit from the viewpoint of miniaturization, low power consumption and safety of the measurement. By way of example, impedance of the measuring circuit should preferably be on the order of G$\Omega$ or $\mu$A.

However, the measuring circuit of a high impedance and a low current as mentioned above is susceptible to induction of environmental or ambient noise voltage, making it difficult or practically impossible to ensure the accuracy and the stability as desired. As the voltage source of induced noise, adjacent phase voltages existing in the vicinity of the measured phase may be mentioned. In reality, there exist an increasing number of sources of induction complicated in accompanying increase in the number of distribution lines in urban district(s).

SUMMARY OF THE INVENTION

In the light of the state of the art described above, it is an object of the present invention to provide a measuring circuit of high impedance and low current suited for measurement of high voltages such as distribution line voltage which can eliminate induction influence of ambient noise voltage sources, to thereby ensure a high-accuracy voltage measurement with high reliability.

In view of the above and other objects which will become apparent as the description proceeds, it is proposed according to an aspect of the present invention that an outer enclosure type shielding resistance member having a significantly lower resistance than a signal circuit arranged in correspondence to an inter-terminal voltage of a high impedance signal circuit is provided and that a function representing a voltage distribution in the shielding resistance member is matched substantially equal to a function representing distribution of an inter-terminal voltage of the signal circuit. By measuring the line voltage through the medium of the high impedance signal circuit provided with the shielding resistance member, measurement of the line voltage can be accomplished with high accuracy without being affected by the induction.

With the arrangement proposed by the present invention, all the induction currents originating in the noise voltage sources are forced to flow through the shielding resistance member disposed around and in opposition to the signal circuit, whereby the induction current is positively prevented from flowing through the signal circuit. Besides, because the function representing the voltage distribution in the signal circuit is essentially matched with that representing the voltage distribution in the shielding resistance member, the inter-terminal voltages of the signal circuit are essentially equal to the voltages at the corresponding points of the shielding resistance member. Consequently, no current flows into parasitic capacitances making appearance between the signal circuit and the shielding resistance member, which means that the influence of the parasitic capacitance can be made negligible. Thus, there can be realized a high impedance measurement circuit which can ensure high precision and accuracy as well as enhanced stability for the measurement.

Other objects, features and advantages of the invention will become apparent from the following description of the embodiments of the invention taken in conjunction with the accompanying drawings.

BRIEF DESCRIPTION OF THE DRAWINGS

In the course of the description which follows, reference is made to the drawings, in which.

DESCRIPTION OF THE EMBODIMENTS

The present invention will be described in detail in conjunction with what is presently considered as preferred or typical embodiments thereof by reference to the drawings.

Figure 1:
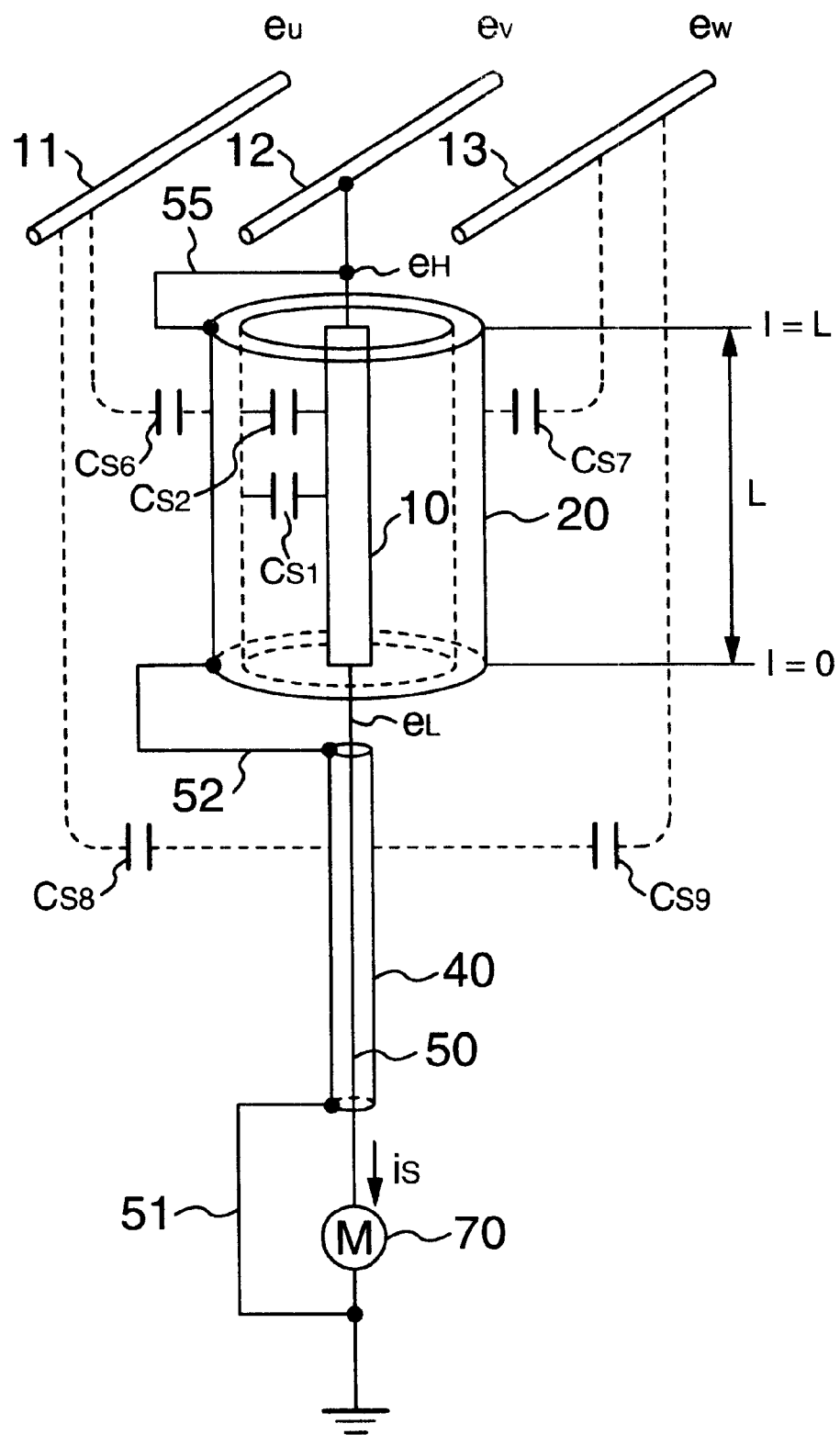
FIG. 1 is a circuit diagram showing schematically a circuit arrangement of an electric circuit provided with shieldings according to a first embodiment of the present invention.

FIG. 1 is a circuit diagram showing schematically a circuit arrangement of an electric circuit which includes shielding members according to a first embodiment of the present invention. Referring to the figure, the electric circuit now under consideration includes balanced three-phase AC distribution lines 11, 12 and 13 which extend in parallel with one another and which carry voltages $e_u$, $e_v$, and $e_w$, to be measured relative to the ground potential, respectively. Connected to the distribution line (electric conductor) 12 which is subjected to the measurement is a meter 70 through the medium of a resistor 10 of a large resistance value. More specifically, the resistor 10 may be constituted by a resistor exhibiting a high dielectric strength and may have a resistance value on the order of 1 GΩ. On the other hand, the meter 70 may be implemented as a high-precision digital ampere meter having a range of several μA.

A shielding member 20 of a cylindrical form is disposed externally around the resistor 10, wherein a high-potential side of the shielding member 20 (top side of the shielding member as viewed in FIG. 1) is electrically connected to a terminal of the resistor 10 located at a high voltage side. On the other hand, a low-potential side of the shielding member 20 (bottom edge of the shielding member 20 as viewed in the figure) is connected to the ground by way of a shielding member 40 provided in association with a wiring conductor 50.

Of the two shielding members 20 and 40, the shielding member 40 is formed of an electrically conductive material. By contrast, the shielding member 20 is made of a resistance material and had an overall or total resistance value which is smaller than that of the resistor 10 by first or second order of magnitude. By way of example, assuming that the resistor 10 has a resistance value of 1 GΩ, the total resistance value of the shielding member 20 may be on the order of 10 MΩ. In a preferred embodiment, the shielding member 20 may be realized in the form of a cylinder or sleeve made of a plastic material having carbon particles mixedly dispersed therein. In that case, the resistance value of the shielding member 20 depends on the quantity of carbon, needless to say.

Figure 2:
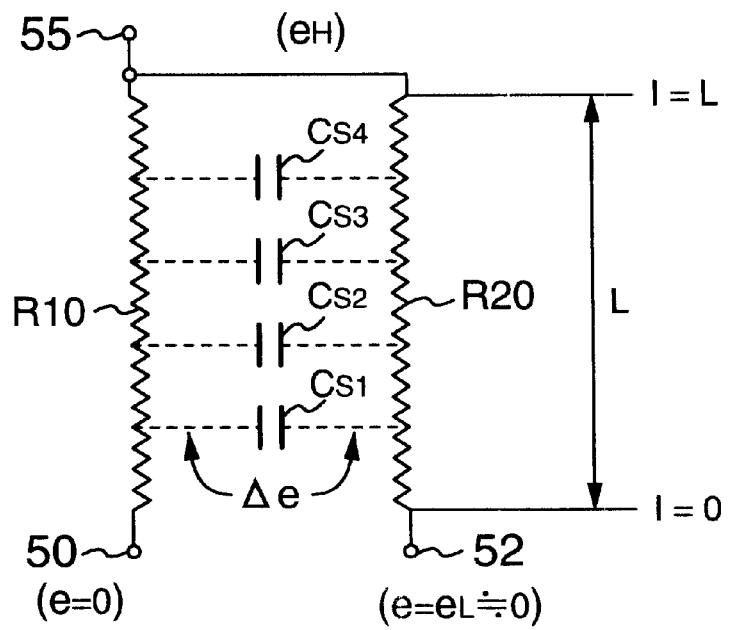
FIG. 2 is an equivalent circuit diagram for illustrating relations existing among a shielding-subjected resistor, a shielding member and parasitic capacitances existing therebetween.
Figure 3:
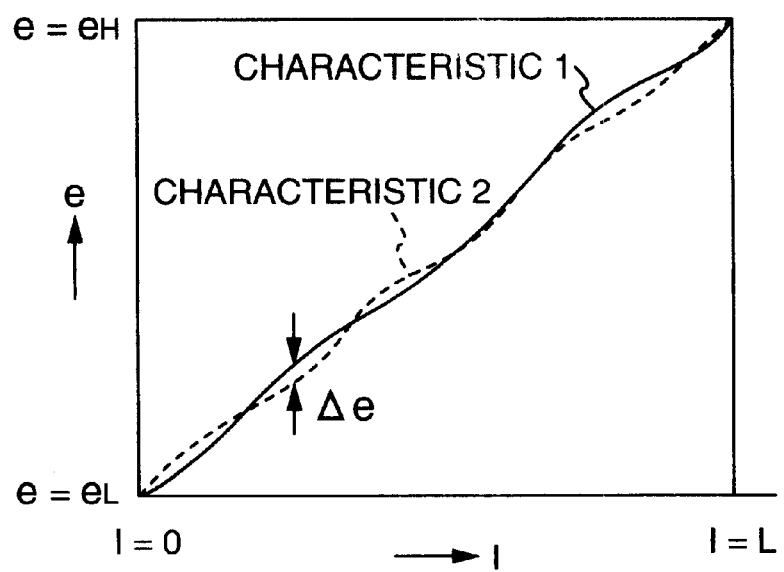
FIG. 3 is a characteristic diagram for illustrating graphically voltage characteristics, respectively, of a resistance circuit to be shielded and a shielding resistor circuit in a direction lengthwise in the electric circuit illustrated in FIG. 1.

Resistance gradient along the longitudinal axis of the shielding member 20, i.e., resistance distribution lengthwise of the shielding member 20, bears an essentially same functional relation to that of the resistor 10. FIG. 2 is an equivalent circuit diagram for illustrating relations among resistance value R10 of the resistor 10, a resistance value R20 of the shielding member 20 and parasitic capacitances $C_{s1}$ to $C_{s4}$ existing parasitically between the resistor 10 and the shielding member 20. Further, FIG. 3 shows voltage distribution characteristics lengthwise of the resistor 10 and the shielding member 20, respectively. In FIG. 3, a solid line curve 1 graphically represents the voltage distribution characteristic of the resistor 10 while a dotted line curve 2 represents a voltage distribution characteristic of the shielding member 20. In FIG. 3, the length of the shielding member and the resistor is taken along the abscissa with voltage or potential being taken along the ordinate. Since both the resistor 10 and, the shielding member 20 are essentially identical in respect to the functional or distribution profile of resistance, the voltage distribution functions of both the resistor 10 and the shielding member 20 are also substantially identical with each other, as a result of which the voltage difference Δe making appearance across the resistor 10 and the shielding member 20 at any given diametrically opposite point is extremely small independently of magnitude of the applied voltage. This in turn means that the current flowing through the parasitic capacitance $C_{s1}, \ldots, C_{s4}$ at discrete locations (see FIG. 2) is also very small and thus the parasitic capacitances $C_{s1}$ to $C_{s4}$ can be neglected.

With the arrangement described above, operation of the electric circuit is performed as follows. The voltage $e_v$ of the phase subjected to the measurement is applied to the meter 70 by way of the resistor 10 of high resistance, giving rise to a signal current flow $i_s$. Representing the voltage to be measured by $e_v$ with the resistance value of the resistor 10 being represented by R10, the signal current $i_s$ is given by $$i_s = e_v/R10 \quad (1)$$

Thus, the voltage $e_v$ can be measured with high accuracy since the resistance value R10 is known and stable.

In the electric circuit shown in FIG. 1, noise currents will flow from the lines or wires 11 and 13 through parasitic capacitances $C_{s6}$ and $C_{s7}$ in addition to the noise current flowing from the phase subjected to the measurement. However, since all of these noise currents flow through the shielding member 20, they can positively be prevented from being admixed to the signal current $i_s$ flowing through the measuring conductor 50. Similarly, the noise currents flowing through parasitic capacitances $C_{s8}$ and $CS_9$ (see FIG. 1) are caused to flow to the ground by way of the shielding member 40 without exerting any appreciable influence to the signal current $i_s$, which also contributes to the realization of high-accuracy measurement with enhanced stability. Besides, because the parasitic capacitance effect brought about by the shielding is extremely small and thus negligible, the shielding can be disposed in proximity, whereby the measuring apparatus can be implemented in a small size.

Figure 4:
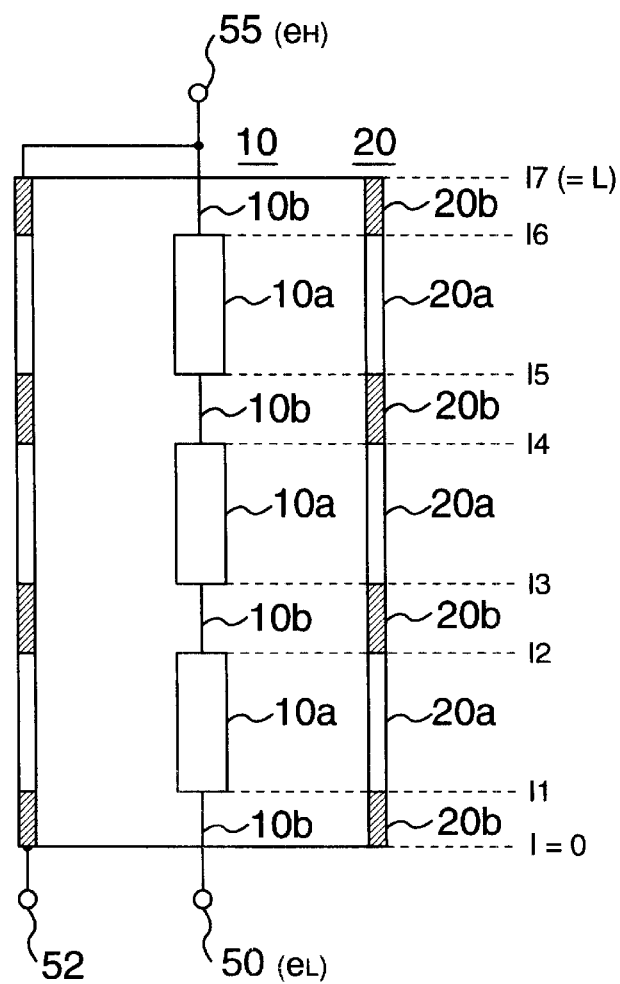
FIG. 4 is a circuit diagram showing schematically a circuit arrangement of an electric circuit including shield members according to a second embodiment of the present invention.

A second embodiment of the present invention will be described by reference to FIG. 4 which shows schematically an equivalent circuit diagram of an electric circuit now concerned. The circuit shown in FIG. 2 includes a plurality of resistors each having a high resistance value so as to be capable of measuring a higher voltage. Referring to FIG. 4, a resistor of high resistance value (hereinafter referred to also as the high-value resistor or resistor string) generally denoted by reference numeral 10 is implemented as a resistance circuitry composed of three discrete resistors 10a connected in series to each other. Accordingly, when viewed in the lengthwise direction, the resistor string 10 can be represented by three discrete resistors 10a and connecting conductors 10b thereof. Similarly, the cylindrical shielding member 20 is constituted by three resistance sections 20a disposed around and diametrically opposite to the discrete resistors 10a, respectively, and electrically conductive sections 20b disposed around and diametrically opposite to the connecting conductors 10b, respectively, each exhibiting essentially no resistance. The electrically conductive sections 20b may be realized by applying electrically conductive films over corresponding sections of the shielding member 20 exhibiting resistance. In the case of the instant embodiment of the invention, the resistance value of the resistance section 20a of the shielding member 20 is represented by a same functional form as that of the discrete resistor 10a. Besides, the resistance value of the resistance section 20a is smaller than that of the discrete resistor 10a by first or second order of magnitude. Accordingly, the voltage distribution function of the shielding member 20 is essentially same as that of the high-value resistor 10.

Figure 5:
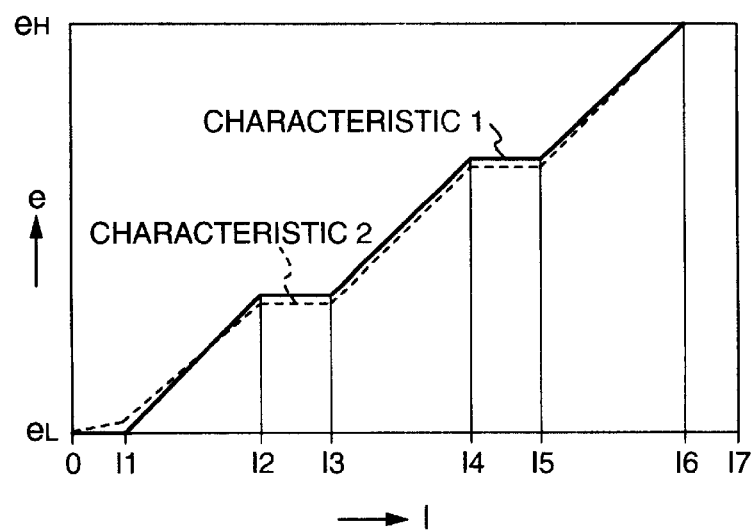
FIG. 5 is a characteristic diagram for illustrating graphically voltage characteristics, respectively, of a resistance circuit to be shielded and a shielding resistor circuit in a direction lengthwise of the electric circuit shown in FIG. 4.

FIG. 5 is a view for graphically illustrating voltage characteristics in the lengthwise direction as viewed in FIG. 4. In the figure, a curve 1 represents the voltage characteristic of the resistor string 10 while a curve 2 represents that of the shielding member 20. By making the voltage distribution function of the resistor string 10 match with that of the shielding member 20 in such a manner as illustrated in FIG. 5, voltages or potentials appearing at any points on the resistor string 10 and the shielding member 20 become substantially equal to one other independently of magnitude of the applied voltage. This means that the parasitic capacitances between the resistor 10 and the shielding member 20 are essentially eliminated at any location and that only the signal current in the intrinsic sense can flow through the resistor 10. Thus, by virtue of the arrangement shown in FIG. 4, high-accuracy measurement which is essentially insusceptible to the influence of noise can be realized even for the high voltage and large resistance value that can not be coped with a single resistor.

The voltage value at a given voltage division point in a resistance circuit is determined by an integrated value of the voltages appearing at succeeding voltage division points. In view of this fact, further measures will have to be taken in the case of the shielding circuit for a non-linear resistance circuit.

Figure 6:
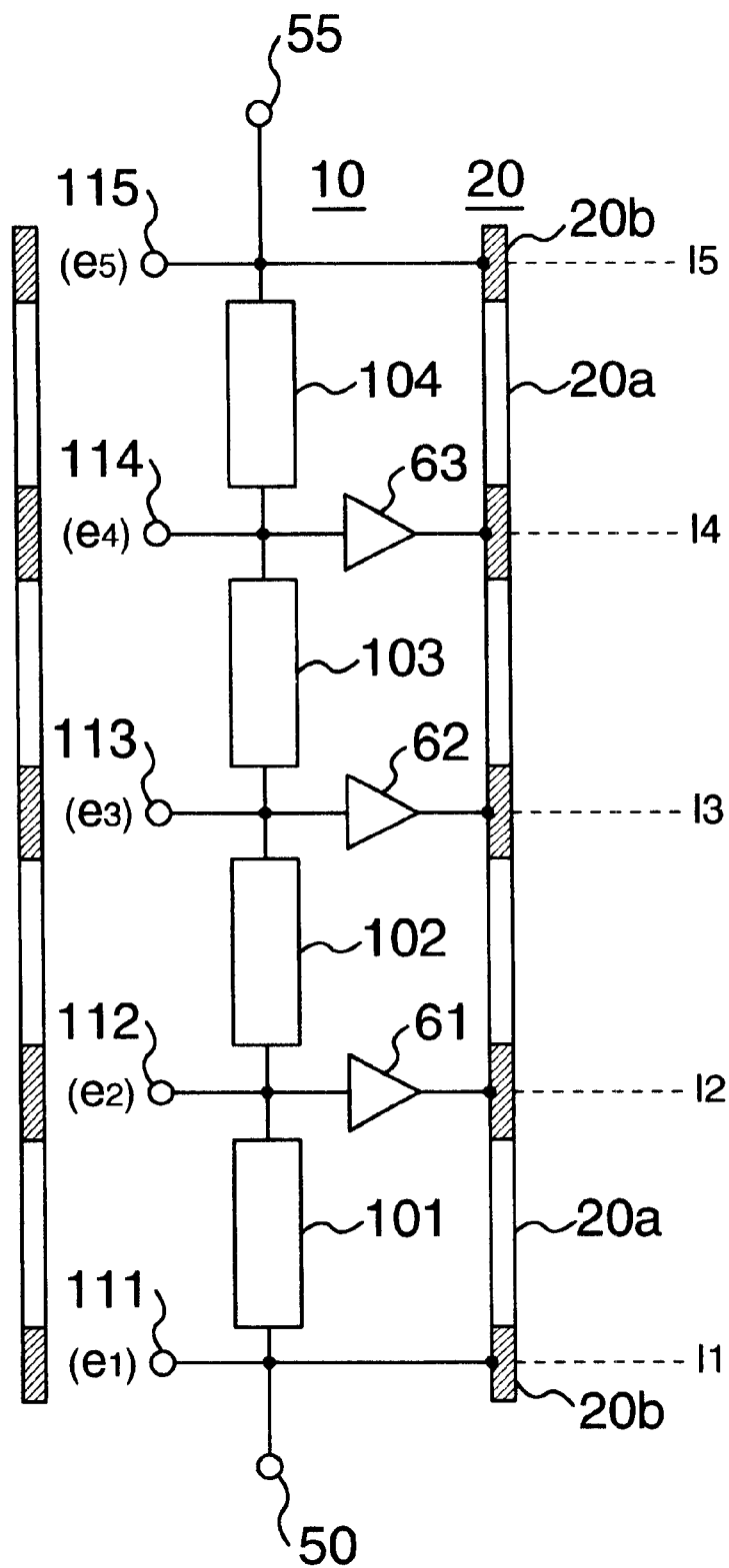
FIG. 6 is a circuit diagram for illustrating schematically an arrangement of the electric circuit according to a third embodiment of the present invention.

Next, referring to FIG. 6 which shows schematically a circuit arrangement according to a third embodiment of the present invention, description will be made of an electric circuit in which a resistor string constituting a resistance circuit a voltage distribution characteristic of a non-linear function. Referring to FIG. 6, a whole resistor string denoted generally by reference numeral 10 is composed of discrete resistors 101, 102, 103 and 104 connected in series to one another. The resistor string 10 is equipped with tap terminals 112, 113 and 114 for tapping divided voltages, respectively, between terminals 111 and 115 at both ends of the resistor string 10. Disposed around the resistor string 10 is a shielding member 20 of a cylindrical form which is composed of resistance sections 20a in correspondence to the discrete resistors 101, 102, 103 and 104 and electrically conductive sections 20b. More specifically, the resistance sections 20a of the shielding member 20 are disposed in opposition to the discrete resistors 101, 102, 103 and 104, respectively, of the resistor string 10 while the electrically conductive sections 20b of the shielding member 20 are disposed in opposition to the tap terminals, respectively, of the resistor string 10. The resistance value of the resistance section 20a of the shielding member 20 is sized smaller than that of the discrete resistor of the resistor string 10 by first or second order of magnitude, as in the case of the preceding embodiment of the invention. The end terminals 111 and 115 of the resistor string 10 are electrically connected to the electrically conductive sections 20b of the shielding member 20 which are located at both ends of the shielding member 20, to thereby form terminals 50 and 55 in the parallel connection as implemented.

Connected to the tap terminals (divided voltage terminals) 112, 113 and 114 of the resistor string 10 are input terminals of buffer amplifiers 61, 62 and 63, respectively, each of which exhibits a high input impedance and has a gain of "1". The output terminals of the buffer amplifiers 61, 62 and 63 are electrically connected to the corresponding electrically conductive sections 20b of the shielding member 20 corresponding to the tap terminals 112, 113 and 114, respectively.

Figure 7:
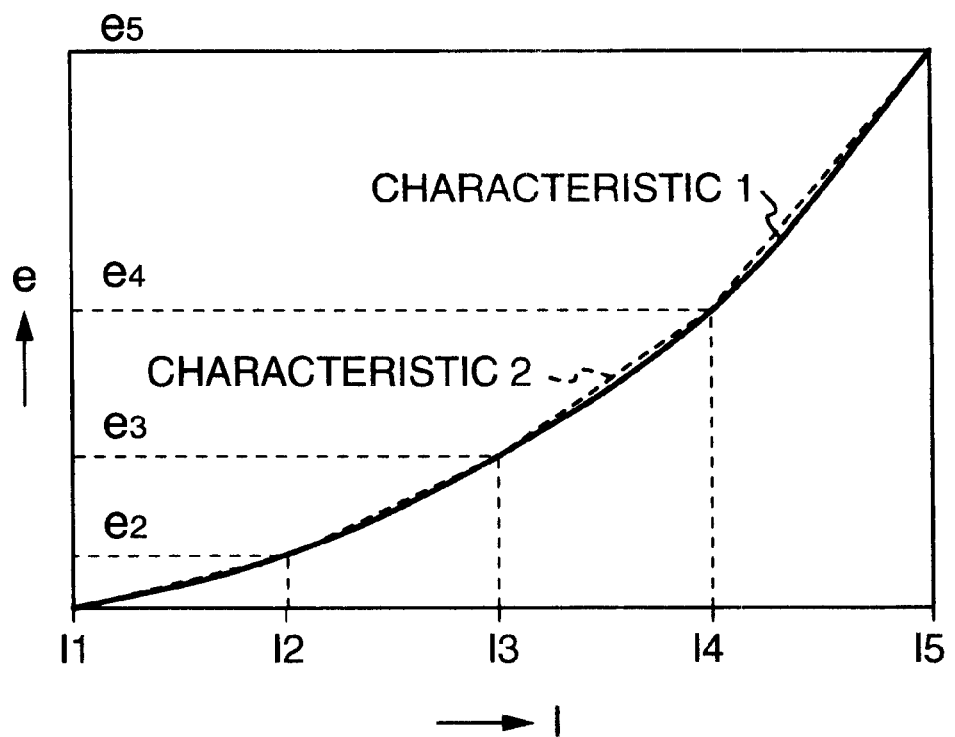
FIG. 7 is a characteristic diagram for illustrating graphically voltage characteristics, respectively, of a resistance circuit to be shielded and a shielding resistor circuit in a direction lengthwise of the electric circuit shown in FIG. 6.

Next, description will be made of operation of the voltage division type electric circuit implemented in the structure shown in FIG. 6. When a voltage is applied across both the end terminals 50 and 55 of the resistor string 10, voltages appearing at the intermediate electrically conductive sections 20b, respectively, of the shielding member 20 are made equal to the divided voltages $e_2$, $e_3$ and $e_4$ appearing at the resistor string 10 owing to operations of the buffer amplifiers 61, 62 and 63, respectively. Operation characteristics of this electric circuit are graphically illustrated in FIG. 7. In this figure, a solid line curve 1 illustrates the voltage division characteristic of the resistor string 10, while a dotted curve 2 illustrates a voltage characteristic of the shielding member 20. As can be seen in the figure, the voltage characteristic of the shielding member 20 (represented by the characteristic curve 2) can be obtained by approximating the non-linear function voltage distribution (represented by the characteristic curve 1) of the resistor string 10 with a multi-point polygon. Since the voltage difference between the opposite points of the shielding member 20 and the resistor string 10 can be made extremely small, the influence of the shielding parasitic capacitance at the opposite points can practically be eliminated. Thus, in addition to the intrinsic shielding operation against the external noise, there can always be ensured a high voltage division accuracy for the voltage division type electric circuit of high resistance.

In the case of the embodiment of the invention described above by reference to FIG. 6, the voltage distribution function of the shielding member can be obtained through polygonal approximation. Thus, there arises substantially no problems even when the resistance characteristic of the object (e.g. resistor string) to be shielded is non-linear or even in the case where the functional form thereof is unknown.

In the case of the embodiments of the invention described above by reference to FIGS. 1 and 4, description has been made that the noise source is an AC source. It should however be pointed out that in the case of the embodiment of the invention shown in FIG. 6, the noise source may be either an AC or a DC source substantially to the same advantageous effect.

The gist of the present invention resides in a shielding structure having a resistance value. In the foregoing description of the embodiments of the invention, it has been presumed that the resistance section of the shielding member is formed in a cylindrical member molded of a plastic material admixed with carbon particles for imparting electrical conductivity. It should however be understood that the invention is never restricted to the use of such cylindrical or sleeve-like member. As one of the alternatives, a cylindrical member of glass may be employed with transparent conductive oxide film electrodes such as of $SnO_2$, $I_{n2}OS$ or the like being sputtered over corresponding portions of the inner surface of the glass cylinder. In that case, since the cylindrical shielding member is transparent, no obstacles in the visual range are provided by the shielding member, which renders it easier to make access to the high-voltage section.

The shielding structure having the resistance value depends on the structure of the concerned resistor or resistor string. Accordingly, when the resistor to be subjected to the shielding are not discrete parts but integral part(s) of a printed wiring circuit formed on a printed circuit board, the shielding resistance member(s) may be disposed as a printed resistor or resistors at both sides of the printed circuit board of concern in parallel thereto or alternatively disposed by printing the shielding resistance members on top and bottom layers of the printed circuit board in a sandwiched structure. An advantage owing to the printing disposition can be seen in that relative dimensions between the opposite points of the resistance and the shielding can be managed with ease. Additionally, in the case where a signal circuit and a shielding circuit are implemented each in a planar circuit structure by resorting to a semiconductor integrated circuit technique, there can equally be obtained similar advantageous effect as in the case of the printed wiring circuit.

Further, the shielding member may be realized in a coated tube-like structure which provides an advantage that the resistor and the shielding can be implemented in an integrated structure of a miniaturized size.

In the foregoing, it has been described that the resistance value of the shielding member required for the desired shielding operation (or effect) should preferably be selected smaller than the resistance value of the shielding-subjected resistor by first or second order of magnitude. However, the resistance value of the shielding member is never restricted to the range mentioned above. By way of example, in the case where a load resistor is provided for the output of the buffer amplifier in a low-voltage circuit as shown in FIG. 6, the lower resistance values of the shielding member can be employed without giving rise to any problem. It should however be pointed out that in the applications where the resistance value of the shielding member is small, as described hereinbefore by reference to FIGS. 1 and 4, electric power consumption increases because of high circuit voltage, which is disadvantageous for miniaturization of the circuit, adoption of the capacity coupling for the coupling with the power distribution line by means of convenient coating capacity and in other respects. Accordingly, the resistance value of the shielding member should not be selected excessively smaller than the resistance range mentioned above.

As is apparent from the foregoing, according to an aspect of the present invention, the shielding is realized by the resistance circuit whose characteristic is essentially same as or equal to that of the resistance circuit (impedance circuit) subjected to the measurement. Thus, the resistance circuit subjected to the measurement can be shielded wholly, not at particular discrete points thereof, whereby the induction noises can effectively be eliminated with high efficiency, and hence high accuracy can be ensured for the measurement. Additionally, because the voltage distribution function of the shielding circuit can be made essentially equivalent to that of the resistance circuit, the parasitic capacitance effect ascribable to the shielding can utterly be neglected. Thus, the teachings of the present invention can be applied to the high-voltage/high-impedance circuits. Moreover, the shielding can be disposed close to the resistance circuit concerned, which is advantageous from the viewpoint of miniaturization. Besides, even if the voltage distribution function or characteristic of the resistance circuit to be shielded is unknown, it can be approximated through polygonal approximation, as described hereinbefore. This in turn means that the present invention can enjoy a wide range of applications.

It should be further understood by those skilled in the art that the foregoing description has been made on embodiments of the invention and that various changes and modifications may be made in the invention without departing from the spirit of the invention and the scope of the appended claims.

What is claimed is:

1. An electric circuit comprising a signal circuit having an impedance circuit connected to two terminals with a voltage therebetween and an electric field shield disposed in opposition to said signal circuit, wherein a potential distribution function representing a potential distribution in said electric field shield is substantially same as that representing a potential distribution in said signal circuit.

2. An electric circuit according to claim 1, wherein said voltage distribution function of said electric field shield is linear.

* * * * *